(12) United States Patent
Swain et al.

(10) Patent No.: US 7,547,622 B2
(45) Date of Patent: Jun. 16, 2009

(54) FABRICATION OF CCD IMAGE SENSORS USING SINGLE LAYER POLYSILICON

(75) Inventors: Pradyumna Kumar Swain, Princeton, NJ (US); David Arthur Furst, Princeton, NJ (US); Mahalingam Bhaskaran, Lawrenceville, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 11/867,064

(22) Filed: Oct. 4, 2007

(65) Prior Publication Data

US 2008/0096373 A1 Apr. 24, 2008

Related U.S. Application Data

(60) Provisional application No. 60/829,975, filed on Oct. 18, 2006.

(51) Int. Cl.
*H01L 21/3205* (2006.01)
*H01L 31/062* (2006.01)
(52) U.S. Cl. .............................. 438/587; 257/E21.294
(58) Field of Classification Search ................ 438/587; 257/E21.294
See application file for complete search history.

(56) References Cited

U.S. PATENT DOCUMENTS

| | | | |
|---|---|---|---|
| 4,352,237 A | 10/1982 | Widmann | |
| 5,288,656 A | 2/1994 | Kusaka et al. | |
| 6,177,333 B1 | 1/2001 | Rhodes | |
| 6,448,592 B1 | 9/2002 | Peek et al. | |
| 6,787,808 B1 | 9/2004 | Zhang et al. | |
| 7,265,397 B1* | 9/2007 | Tower et al. | 257/223 |
| 2005/0082582 A1* | 4/2005 | Rhodes | 257/291 |
| 2006/0290799 A1 | 12/2006 | Uya | |

OTHER PUBLICATIONS

International Search Report, dated Apr. 3, 2008.

* cited by examiner

*Primary Examiner*—Matthew Smith
*Assistant Examiner*—Walter H Swanson
(74) *Attorney, Agent, or Firm*—Lowenstein Sandler PC

(57) ABSTRACT

A method for fabricating CCD imaging structures is disclosed, comprising the steps of providing a silicon substrate; growing a dielectric layer substantially overlying the silicon substrate; depositing a first layer of polysilicon substantially overlaying the dielectric layer; removing at least a portion of the first layer of polysilicon to form a plurality of polysilicon gates and first predetermined inter-gate gaps, each of plurality of the polysilicon gates having a predetermined line width; depositing a second layer of polysilicon of a predetermined thickness substantially overlaying the plurality of polysilicon gates and the first predetermined inter-gate gaps; removing at least a portion of the second layer of polysilicon from between gates of the plurality of polysilicon gates to define a plurality of non-overlapping polysilicon gates and second predetermined inter-gate gaps that expose the dielectric layer, the second predetermined inter-gate gaps being smaller than the first predetermined inter-gate gaps.

17 Claims, 2 Drawing Sheets

US 7,547,622 B2

FABRICATION OF CCD IMAGE SENSORS USING SINGLE LAYER POLYSILICON

CROSS-REFERENCE TO RELATED APPLICATIONS

This application claims the benefit of U.S. provisional patent application No. 60/829,975 filed Oct. 18, 2006, the disclosure of which is incorporated herein by reference in its entirety.

FIELD OF THE INVENTION

The field of the present invention is semiconductor device fabrication. More specifically, the present invention relates to a method for manufacturing CCD image sensors having single layer poly-silicon gates using conventional photolithographic techniques and equipment.

BACKGROUND OF THE INVENTION

Conventional CCD image sensors are fabricated using multiple layers of polysilicon separated by inter-poly dielectrics (oxides). A portion of a conventional CCD image sensor is shown in FIG. 1. FIG. 1 depicts a three-phase polysilicon gate CCD image sensor structure having a plurality of gates 2 separated from each other by a layer of inter-poly dielectric 4. The polysilicon gates 2 also overlay an insulating layer of oxide 6 which substantially overlays a silicon substrate 8. The insulating layers 4 and 6 electrically isolate the gates 2 from each other and from the substrate 8, respectively. The gates 2 are of three types, each type manufactured using a distinct layer of polysilicon. The first type, called poly-1 10, is generally flat on both sides. The second type, called poly-2 12 has an overlap 14 on one side which overlaps one side of the poly-1 gate 10. The third type, called poly-3 16, has overlaps 18, 20 on both sides that overlap the poly-2 gate 12 and the poly-1 gate 10. Poly-1 gate 10, poly-2 gate 12, and poly-3 gate 16, portions of inter-poly-oxide layers 4, an underlying portion of oxide layer 6, and a portion of the silicon substrate 8 constitute a three phase CCD pixel 22.

This type of multiple poly CCD pixel structures can be manufactured using conventional photolithographic processes. The three-phase poly gate structure shown in FIG. 1 can be manufactured using the following procedure. In a first step, a dielectric layer 6 is deposited or grown on the silicon substrate 8. A first layer of polysilicon is deposited substantially overlaying the dielectric layer 6. Using a conventional photolithographic method and anisotropic etching, the poly-1 gates 10 are defined. This is followed by growing or depositing a first layer of inter-poly dielectric 4 substantially overlaying the poly-1 gates 10. Then, a second layer of polysilicon is deposited substantially overlaying the inter-poly dielectric 4 and the poly-1 gates 10, followed by photolithography and etching to define the poly-2 gates 12. Another portion of the inter-poly dielectric 8 is grown or deposited overlying both the poly-1 gates 10 and the poly-2 gates 12. Then, a third layer of polysilicon is deposited substantially overlaying the inter-poly dielectric 4, the poly-1 gates 10, and the poly-2 gates 12, followed by photolithography and anisotropic etching to define the poly-3 gates 16. Another portion of the inter-poly dielectric 8, followed by an insulating layer like PPSG, is deposited overlying poly-1 gates 10, poly-2 gates 12, and poly-3 gates 16 to complete the process.

In operation, charge is collected under any one of the polysilicon gates 10, 12, 16, and subsequently transferred to a another of the polysilicon gates 10, 12, 16 by the application of appropriate bias to each of the polysilicon gates 10, 12, 16. The inter-poly dielectric layer 8 keeps the gates 10, 12, and 16 isolated from each other so that different potentials can be applied to different types of gates. As a byproduct, the inter-poly dielectric 8 creates potential barrier "bumps" which the charges must overcome to be successfully transferred to a subsequent gate. If the separation between the gates is great, i.e., the inter-poly-oxide thickness is too large, then collected charge cannot clear the "bump" and the transfer becomes less efficient or does not occur. If the inter-poly dielectric thickness is too small, then a premature dielectric breakdown can occur between gates.

Charge transfer between phases depends on the spacing of polysilicon gate edges and resulting electric fringing fields between them. A desirable thickness that produces efficient charge transfer is about 0.2 microns between gates. It would also be desirable to create the polysilicon gates 10, 12, 16 using only a single layer of polysilicon and no overlap. Unfortunately, prior art methods of manufacturing gates with single layer polysilicon cannot achieve 0.2 micron gaps using conventional lithographic tools in a highly reproducible manner. This problem is alleviated by the multi-layer polysilicon technique, where it is relatively easy to define 0.2 micron gaps via the deposition or growing of inter-poly-oxide layers 8 and overlapping gates. These polysilicon overlaps add capacitance, which in turn, slows down the operation of the CCD. Imagers employing overlapping multiple poly gates are susceptible to ESD damage during the manufacturing process and the edges of the gates can lift from the surface of the oxide (dielectric) layer 8 due to the subsequent oxidation of the patterned polysilicon, producing uneven inter gate gap thicknesses which results in premature electrical breakdown. There are more sophisticated photolithographic tools available in the prior art which can define inter-gate gaps of 0.2 microns, but these tools are themselves expensive.

Accordingly, what would be desirable, but has not yet been provided is a method for manufacturing CCD image sensors having single layer poly-silicon gates employing conventional photolithographic techniques and equipment.

SUMMARY OF THE INVENTION

Disclosed is method for fabricating CCD imaging structures having single layer polysilicon gates and employing conventional photolithographic techniques and equipment, comprising the steps of providing a silicon substrate; growing a dielectric layer substantially overlying the silicon substrate, depositing a first layer of polysilicon substantially overlaying the dielectric layer; removing at least a portion of the first layer of polysilicon to form a plurality of polysilicon gates and first predetermined inter-gate each of plurality of the polysilicon gates having a predetermined line width; depositing a second layer of polysilicon of a predetermined thickness substantially overlaying the plurality of polysilicon gates and the first predetermined inter-gate gaps; removing at least a portion of the second layer of polysilicon seas to define a plurality of non-overlapping polysilicon gates and second predetermined inter-gate saps that expose the dielectric layer, the second inter-state saps being smaller than the first predetermined inter-gate naps having the desired inter-gap thickness. A photolithographic process can be applied to the first layer of polysilicon to form a desired gate pattern followed by anisotropically etching the first layer of polysilicon to remove at least a portion of the first layer of polysilicon so as to form the polysilicon gates and the first predetermined inter-gate gaps. Removing at least a portion of the second layer of polysilicon can be accomplished by anisotropically etching the second layer of polysilicon to define a plurality of non-overlapping polysilicon gates and second predetermined inter-gate gaps. The second layer of polysilicon and the first layer of polysilicon can be doped to form n type or p type conductive regions. A dielectric layer of oxide can be grown substantially overlaying the non-overlapping polysilicon gates and exposed dielectric layer.

SUMMARY DESCRIPTION OF THE DRAWINGS

Figure 1:
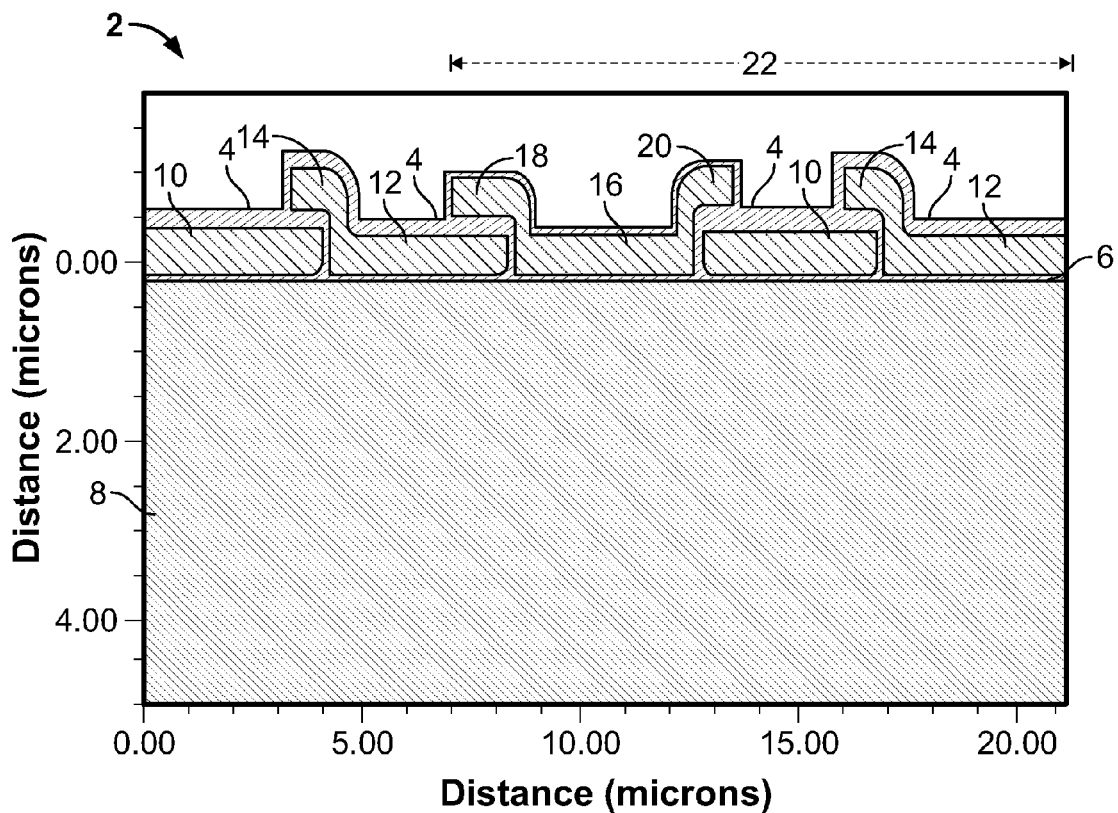
FIG. 1 is a cross-sectional view of a conventional three phase CCD imaging structure with overlapping gates manufactured using conventional photolithographic techniques known in the prior art.
Figure 2:
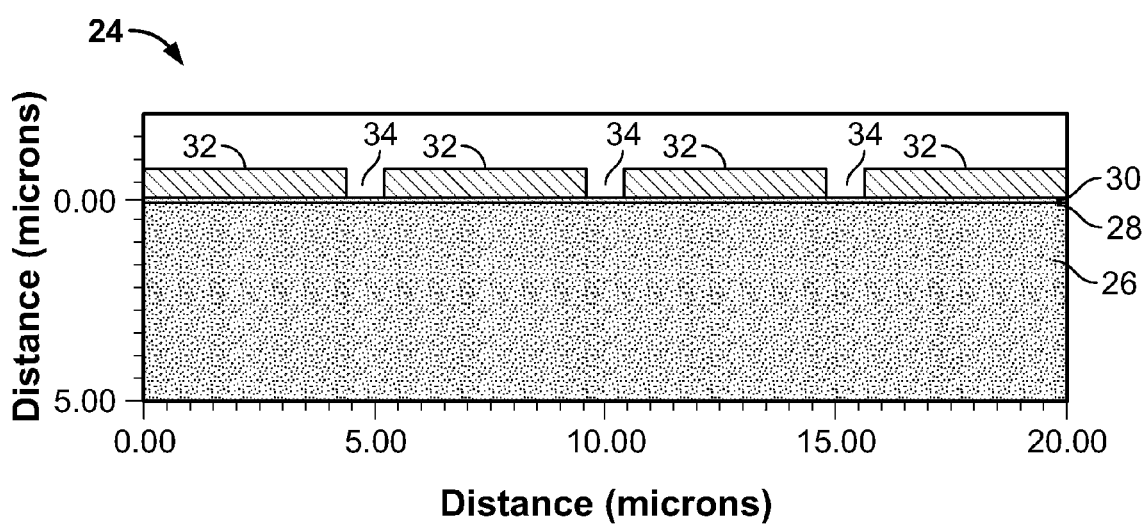
FIG. 2 is cross-sectional view of a CCD imaging structure after the deposition of a layer of polysilicon, the layer having been etched to define poly gates with predetermined inter-gate gaps, constructed using conventional photolithographic techniques according to an embodiment of the present invention.
Figure 3:
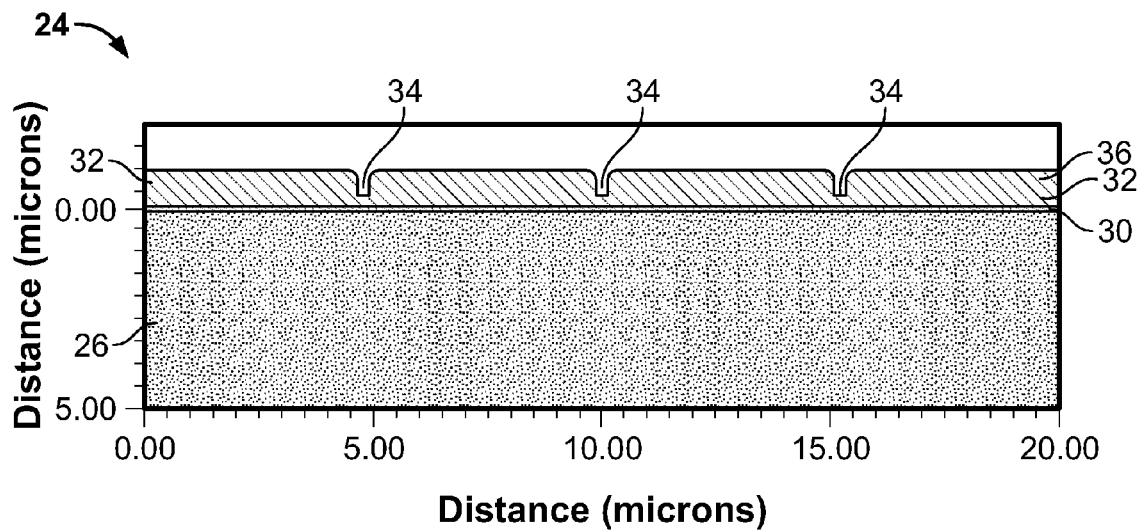
Figure 4:
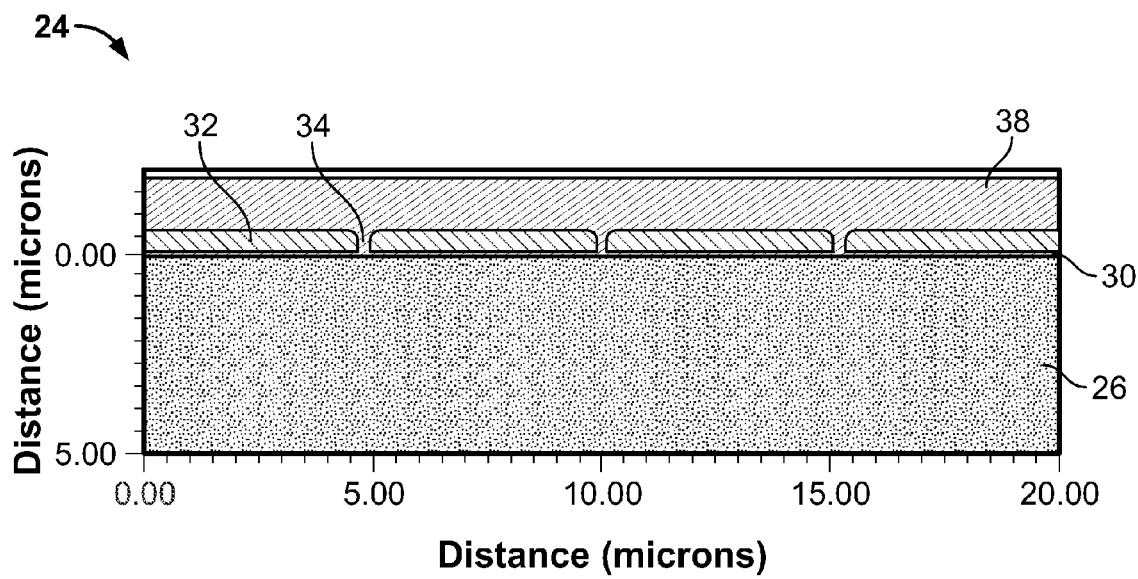

FIG. 3 is a cross-sectional view of the CCD imaging structure of FIG. 2 after the deposition of a layer of an additional amount of polysilicon deposited over defined polysilicon gates so as to reduce the gap between the gates; and FIG. 4 is a cross-sectional view of the final CCD imaging structure of the present invention having single layer polysilicon gates with desired predetermined inter-gate gap size.

DETAILED DESCRIPTION OF THE INVENTION

The following embodiments are intended as exemplary, and not limiting. In keeping with common practice, figures are not necessarily drawn to scale.

The steps for manufacturing a CCD imaging structure according to an embodiment of the present invention are depicted in FIGS. 2-4. In FIG. 2, the manufacture of an illustrative CCD imager 24 begins with a silicon substrate 26 having a generally flat active surface 28. A layer of silicon dioxide (dielectric) 30 of a predetermined thickness is grown substantially overlaying the surface 28. By growing the dielectric layer 30, what is meant is that certain species such as oxygen or steam are passed into a chamber (not shown) containing the silicon substrate 26. Oxygen atoms react with the active surface 28 of the substrate 26 so as to grow the layer of silicon dioxide 30. In a second manufacturing step, a layer of polysilicon (not shown) of a predetermined thickness, preferably about 0.5 um, is deposited substantially overlaying the layer of silicon dioxide 30. Using standard photolithographic techniques and equipment, the 0.5 um of polysilicon is anisotropically etched to define a plurality of polysilicon gates 32, wherein the gates 32 can have line widths as defined by CCD structure requirement, which can range anywhere from 0.5 um to 12 um. Inter-gate gaps 34 having a predetermined width between the gates 32 are also defined by photolithography and anisotropic etching. In a preferred embodiment, these inter-gate gaps have a width of between about 0.3 um and 2.3 um. This can be achieved by conventional photolithographic tools.

Referring now to FIG. 3, an additional layer of polysilicon 36 is deposited substantially overlaying the defined polysilicon gates 32 so as to reduce the gaps between the polysilicon gates 32. This additional deposition layer 36 has a predetermined thickness which is about one half the thickness needed to decrease inter gate gaps to a desired width. In a preferred embodiment, wherein the desired inter-gate thickness is about 0.2 um, and the inter-gate thickness defined by photolithographic process via anisotropic etching is about 0.8 um, the thickness of the additional deposition layer 36 is about 0.3 um. Note in FIG. 3 that the additional deposition layer 36 conforms to all surfaces so that the polysilicon gates 32 are temporarily thicker than desired and there is no exposed oxide layer 30 in the inter-gate gaps 34, which are also reduced in height and width.

In order to render the polysilicon more conductive for the addition of electrodes, the additional deposition layer 30 and the polysilicon gates 32 can be doped to a predetermined desired conductivity. In a preferred embodiment, the additional deposition layer 30 and the polysilicon gates 32 are heavily doped to produce an n+ type or p+ type conductive material. Doping can be effected by diffusion of phosphorus atoms via phosphene gas. In other embodiments, doping can be achieved by ion implantation.

Referring now to FIG. 4, the polysilicon gates 32 with desired inter-gate gaps 34 are defined by an anisotropic etching step. In a preferred embodiment, the inter-gate gaps 34 are now about 0.2 um in width. The polysilicon gates 32 can be isolated electrically from each other by the deposition of a dielectric layer 38 before the addition of electrical contacts (not shown).

While the preferred embodiment of the present invention has been described in terms of the deposition of polysilicon to create single-layer polysilicon gates, in other embodiments, the technique of the present invention is suitable for creating single layer gates made from other conductive materials, such as metals.

The present invention has several advantages over the prior art methods of manufacturing CCD imager structures and the resulting devices. The present invention has fewer processing steps than in a multi-layer polysilicon manufacturing method. Fewer steps translates into lower cycle time, higher yields, and lower manufacturing costs. A second advantage of the present invention is the resulting device has lower susceptibility to ESD damage. Front side non-pattern polysilicon and back side polysilicon needs to be removed in both the process of the present invention and in a multi-layer polysilicon process. The back side polysilicon is removed using a plasma etch process, which subjects a device to ionizing radiation. In a multi-layer polysilicon process, when the poly-2 layer on the back side is removed, there still exists a poly-1 layer pattern of conductive lines on the front side. When the poly-3 layer on the back side is removed, poly-1 and poly-2 layers are already patterned on the front side. These patterned layers are susceptible to ESD damage during a backside poly-removal operation using a plasma etch. In the present invention, there is only one layer of polysilicon which needs to be removed and there are no lines of conductive patterns on the front side during the backside poly removals, and therefore there is no threat of ESD damage.

A third advantage is the elimination of polysilicon edge lifting during manufacturing, resulting in higher operating clock voltages. As discussed above, in the conventional multi-layer polysilicon gate manufacturing process, every time a poly-gate is defined, the next step is to grow a channel oxide. For example, after a poly-1 gate is defined, there will be an oxide grown on top of the poly-gate, the side wall of the poly-gate, and the space between poly-gates. Since polysilicon is made of several grains, the silicon oxide grows under the edge of the poly-gate and lifts the entire grain structure. A sidewall chunk of grain begins to lift up. When lifted, the resulting inter-gate gap is not very uniform, so that there will be regions where the poly-gate gaps are narrower than expected, and regions where the gaps are larger than expected, i.e., different from the assumed predetermined gap between the poly-gates. In regions where the oxide thickness is smaller than expected, dielectric breakdown happens at lower applied gate voltages. Because of this, the operation of multiple poly-gate structures is restricted to lower than optimal clock voltages. The single poly-gate structure of the present invention is not susceptible to edge lifting, so that it may be operated at higher clocking voltages which allows for deeper potential wells and therefore greater charge collection capacity.

A fourth advantage is that the elimination of overlapping polysilicon gates results in lower peripheral capacitance. This enhances the speed of CCD operation. In conventional CCD gates, there are two sources of capacitance: one is caused by gap between the poly-gates along the side walls and the second is the overlying "overlap" region between one gate and another gate. Overlap capacitance is eliminated with a single poly-gate structure. The reduction of this overlap capacitance will enhance the speed of operation. A fifth advantage is that in a single poly, non-overlapping CCD structure, it is easier to silicide the poly gates, resulting in lower resistivity of at least an order of magnitude.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed:

1. A method for fabricating CCD imaging structures comprising the steps of;
   providing a silicon substrate;
   growing a dielectric layer overlying the silicon substrate;
   depositing a first layer of polysilicon overlying the dielectric layer;
   removing at least a portion of the first layer of polysilicon to form a plurality of polysilicon gates and first predetermined inter-gate gaps, each of plurality of the polysilicon gates having a predetermined line width;
   depositing a second layer of polysilicon of a predetermined thickness overlying the plurality of polysilicon gates and the first predetermined inter-gate gaps; and
   removing at least a portion of the second layer of polysilicon from between gates of the plurality of polysilicon gates to define a plurality of non-overlapping polysilicon gates and second predetermined inter-gate gaps that expose the dielectric layer, the second predetermined inter-gate gaps being smaller than the first predetermined inter-gate gaps.

2. The method of claim 1, wherein the step of removing at least a portion of the first layer of polysilicon to form a plurality of polysilicon gates and first predetermined inter-gate gaps further comprises the steps of:
   applying photolithography to the first layer of polysilicon to form a desired gate pattern; and
   anisotropically etching the first layer of polysilicon to remove at least a portion of the first layer of polysilicon to form the polysilicon gates and the first predetermined inter-gate gaps.

3. The method of claim 2, wherein the step of removing at least a portion of the second layer of polysilicon from between gates of the plurality of polysilicon gates further comprises the step of anisotropically etching the second layer of polysilicon to define the plurality of non-overlapping polysilicon gates and second predetermined inter-gate gaps.

4. The method of claim 3, further comprising the step of doping the second layer of polysilicon and the first layer of polysilicon.

5. The method of claim 4, wherein the second layer of polysilicon and the first layer of polysilicon are doped with one of n type and p type dopants.

6. The method of claim 4, wherein the second layer of polysilicon and the first layer of polysilicon are doped via diffusion.

7. The method of claim 4, wherein the second layer of polysilicon and the first layer of polysilicon are doped via ion implantation.

8. The method of claim 4, further comprising the step of siliciding the non-overlapping polysilicon gates to increase conductivity.

9. The method of claim 1, further comprising the step of depositing a dielectric layer overlying the non-overlapping polysilicon gates and exposed dielectric layer.

10. The method of claim 9, wherein the dielectric layer overlying the silicon substrate and the dielectric layer overlying the non-overlapping polysilicon gates are made of silicon dioxide.

11. The method of claim 1, wherein the width of each of the second predetermined inter-gate gaps is about 0.2 um.

12. The method of claim 11, wherein the width of each of the first predetermined inter-gale gaps is between about 0.3 um and 2.3 um.

13. The method of claim 12, wherein the predetermined line width of each of the polysilicon gates is between about 0.5 um and about 12 um.

14. A method for fabricating CCD imaging structures, comprising the steps of:
   providing a silicon substrate;
   growing a dielectric layer overlying the silicon substrate;
   depositing a first layer of a conductive material overlying the dielectric layer;
   removing at least a portion of the first layer of conductive material to form a plurality of conductive gates and first predetermined inter-gate gaps, each of plurality of the conductive gates having a predetermined line width;
   depositing a second layer of the conductive material of a predetermined thickness overlying the plurality of conductive gates and the first inter-gate gaps; and
   removing at least a portion of the second layer of conductive material from between gates of the plurality of conductive gates to define a plurality of non-overlapping conductive gates and second predetermined inter-gate gaps that expose the dielectric layer, the second predetermined inter-gate gaps being smaller than the first predetermined inter-gate gaps.

15. The method of claim 14, wherein the conductive material is metal.

16. The method of claim 14, wherein the step of removing at least a portion of the first layer of conductive material to form a plurality of conductive gates and first inter-gate gaps further comprises the steps of:
   applying photolithography to the first layer of conductive material to form a desired gate pattern; and
   anisotropically etching the first layer of conductive material to remove at least a portion of the first layer of conductive material to form the conductive gates and the first predetermined inter-gate gaps.

17. The method of claim 16, wherein the step of removing at least a portion of the second layer of conductive material from between gates of the plurality of conductive gates further comprises the step of anisotropically etching the second layer of conductive material to define the plurality of non-overlapping conductive gates and second predetermined inter-gate gaps.

* * * * *